United States Patent [19]

Yee et al.

[11] Patent Number: 4,996,452
[45] Date of Patent: Feb. 26, 1991

[54] ECL/TTL TRISTATE BUFFER

[75] Inventors: Loren Yee, Milpitas; Nguyen X. Sinh, San Jose, both of Calif.

[73] Assignee: National Semiconductor Corporation, Santa Clara, Calif.

[21] Appl. No.: 436,846

[22] Filed: Nov. 15, 1989

[51] Int. Cl.$^5$ ............................................. H03K 19/02
[52] U.S. Cl. ................................... 307/475; 307/455; 307/456; 307/473
[58] Field of Search ................. 307/475, 455, 456, 473

[56] References Cited

U.S. PATENT DOCUMENTS

| | | | |
|---|---|---|---|
| 4,623,803 | 11/1986 | Thompson et al. | 307/475 |
| 4,644,194 | 2/1987 | Birrittella et al. | 307/475 |
| 4,677,320 | 6/1987 | Hannington | 307/475 |
| 4,678,944 | 7/1987 | Williams | 307/475 |
| 4,857,776 | 8/1989 | Khan | 307/475 |

Primary Examiner—Stanley D. Miller
Assistant Examiner—Scott A. Ouellette
Attorney, Agent, or Firm—Townsend and Townsend

[57] ABSTRACT

An ECL/TTL translation circuit for translating ECL level input signals, which have a high voltage state and a low voltage state, to TTL level output signal, which have a high voltage state and a low voltage state. The translation circuit includes an ECL input circuit, a level shifter, a TTL output circuit a tristate controller. The ECL input circuit receives the ECL level input signals and generates an intermediate voltage signal corresponding to the ECL level input signal. The level shifter is coupled to the ECL input circuit and maintains the intermediate voltage signal in a desired range of voltages. The TTL output circuit receives the intermediate voltage signal and generates a TTL output signal that corresponds to the intermediate voltage signal and, therefore, corresponds to the ECL input signal. The tristate controller receives the tristate signal and causes the TTL output circuit to enter a high impedance mode when a high level tristate signal is received.

14 Claims, 2 Drawing Sheets

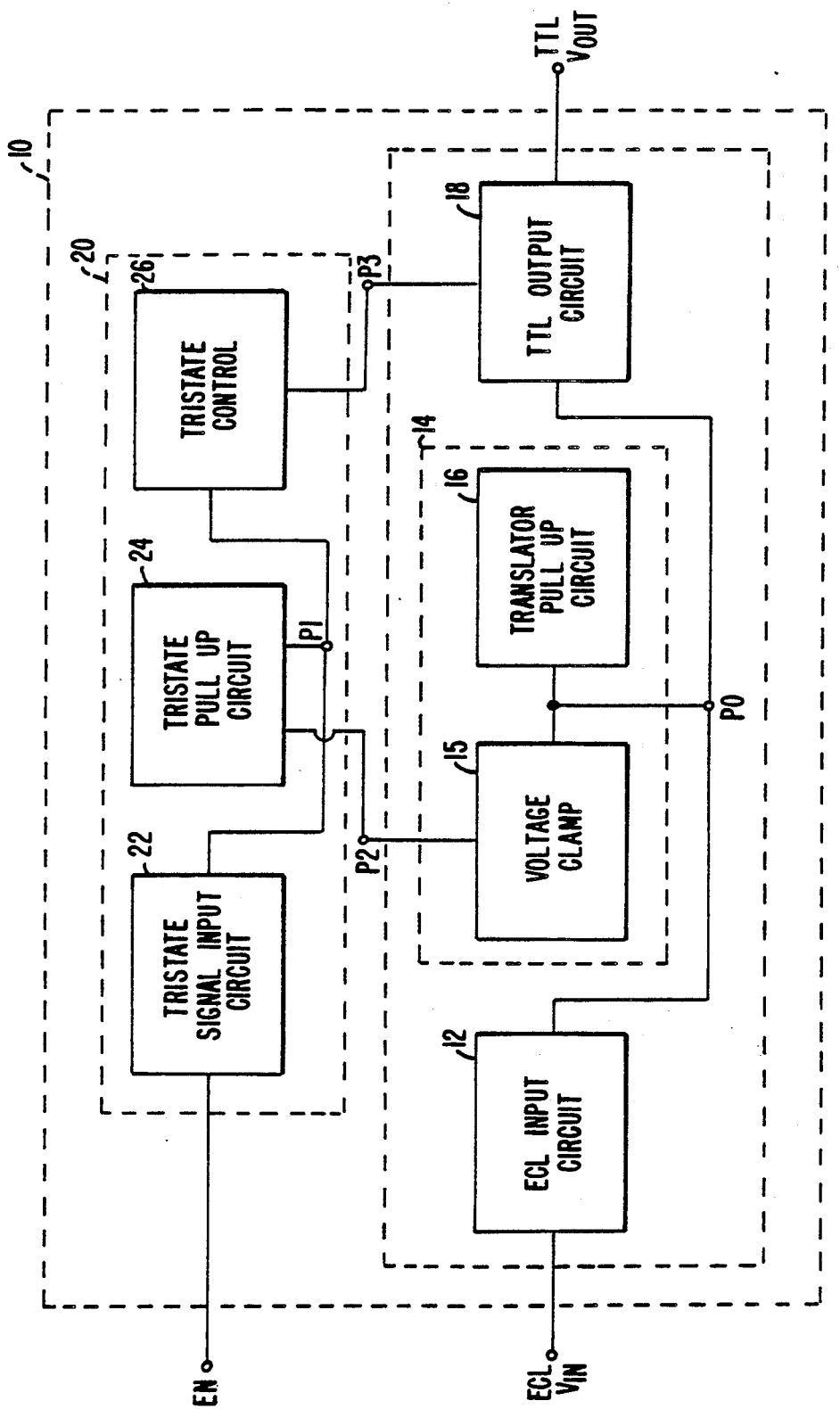
FIG._1.

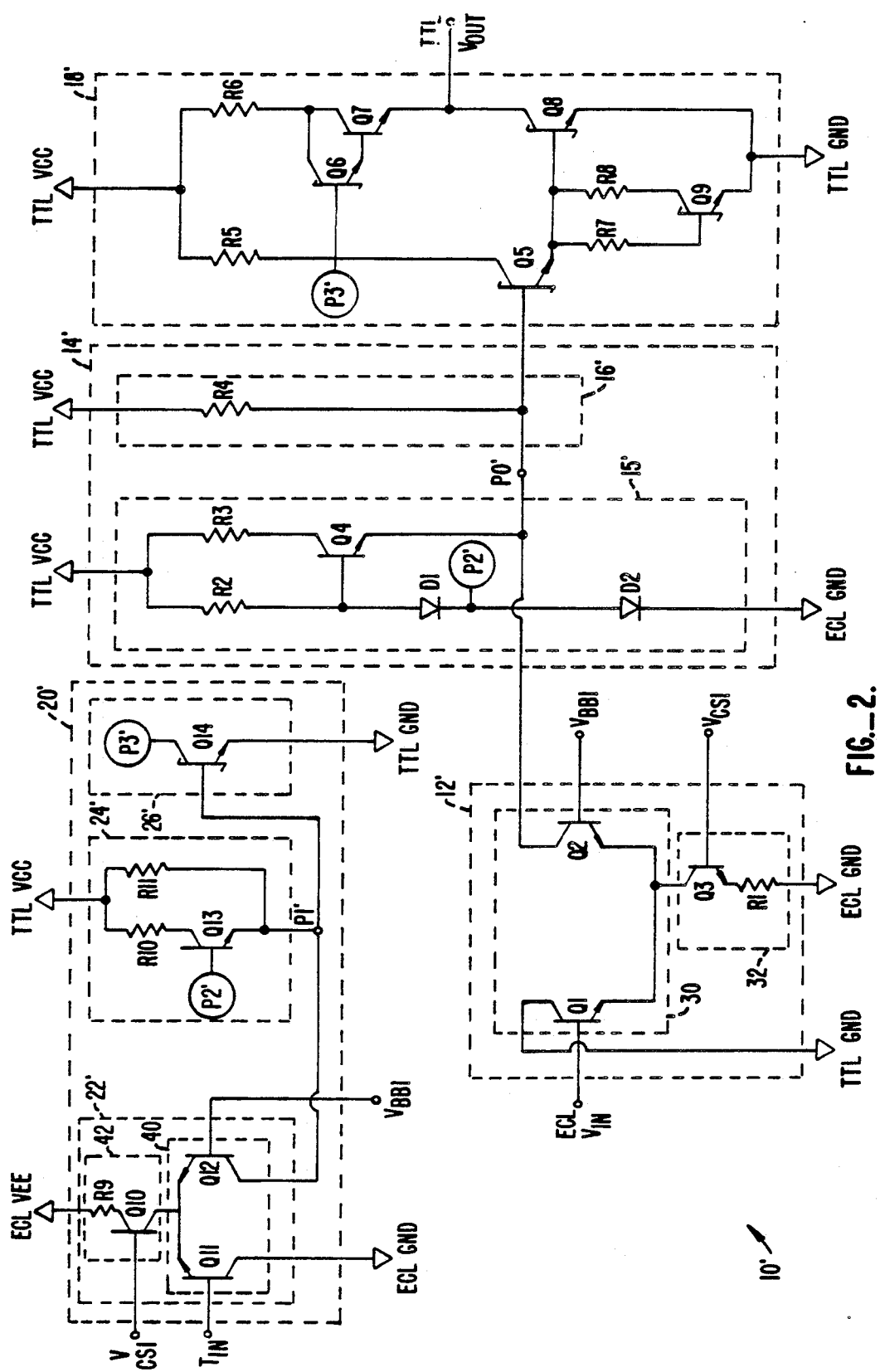
FIG._2.

ECL/TTL TRISTATE BUFFER

CROSS REFERENCE TO RELATED APPLICATIONS

Related co-pending applications include "ECL/TTL TRANSLATOR CIRCUIT" filed Nov. 15, 1989, Ser. No. 437,473 and "TTL/ECL TRANSLATOR CIRCUIT", filed Nov. 15, 1989, Ser. No. 436,842.

BACKGROUND OF THE INVENTION

The present invention relates generally to translator circuits, and more specifically, to emitter coupled logic (ECL) to transistor-transistor logic (TTL) tristate buffer circuits for receiving tristate signals and ECL voltage level input signals and for generating tristated TTL voltage level output signals.

TTL circuitry and ECL circuitry are two well known types of digital circuitry for use in computers and other logic devices. In TTL circuitry a binary "1" is represented by high voltage level between 2.5 and 5 volts, and a binary "0" is represented by a low voltage level between 0 and 0.8 volts. TTL circuitry is generally known for operating at high speed and having low power requirements.

ECL circuitry generally operates at negative voltage with the high and low level voltage signal established on either side of a desired negative reference voltage. For example, if a reference voltage is −1.16 volts, a binary "1" may be represented by a voltage level of −0.8 volts and a binary "0" may be represented by voltage level of −1.5 volts. ECL circuitry is generally known for higher speed switches.

To obtain the advantages of employing both ECL and TTL circuitry on a single integrated circuit or in a system using many circuits, translators are required for translating the binary data from the ECL voltage level to the TTL voltage level.

Multiple translators may be used in more complex circuitry and devices. However, each translator will require a separate communications bus unless the communications translators are multiplexed. In multiplexing, only one translator sharing a bus is generating a signal while the remaining translators are in a high impedance mode. Therefore, each translator sharing a bus must be a tristated translator having three signals (high, low, and high impedance).

SUMMARY OF THE INVENTION

The present invention provides an ECL/TTL tristate buffer circuit for translating tristate signals, which have a high voltage state and a low voltage state, ECL level input signals, which have a high voltage state and a low voltage state, to tristated TTL level output signals, which have a high voltage state, a low voltage state, and a high impedance state.

The tristate buffer includes an ECL input circuit, a level shifter, a TTL output circuit and a tristate controller. The ECL input circuit receives the ECL level input signals and generates an intermediate voltage signal corresponding to the ECL level input signal. The level shifter is coupled to the ECL input circuit and maintains the intermediate voltage signal in a desired range of voltages. The TTL output circuit receives the intermediate voltage signal and generates a TTL output signal that corresponds to the intermediate voltage signal and, therefore, corresponds to the ECL input signal. The tristate controller receives the tristate signal and causes the TTL output circuit to enter a high impedance mode when a high level tristate signal is received.

The ECL input circuit includes an ECL cascode stage for comparing the ECL input signal with a reference signal. The ECL input circuit also includes a current source for providing a switching current to the ECL cascode. The level shifter includes a voltage clamp for preventing the intermediate voltage signal from entering a constant low state. The level shifter also includes a pull-up circuit for preventing the intermediate voltage signal from entering a constant high state.

The tristate controller includes a tristate signal input circuit, a tristate pull-up circuit, and a tristate control circuit. The tristate signal input circuit receives the tristate signals and generates an intermediate tristate voltage signal corresponding to the tristate signal. The tristate signal input circuit includes a tristate signal cascode for comparing the tristate signal with a reference signal. The tristate signal input circuit also includes a tristate current source for providing a switching current to the tristate signal cascode. The tristate pull-up circuit prevents the intermediate tristate voltage signal from entering a constant low state. The tristate control circuit receives the intermediate tristate voltage signal and causes the TTL output circuit to enter a high impedance state when the intermediate tristate voltage circuit is in a high state and, therefore, the tristate signal is in a high state.

In a preferred embodiment, the circuit of the present invention contains few active devices, resulting in the tristate buffer circuit being more reliable and faster. The level shifter is primarily composed of resistors and diodes coupled in series, thereby minimizing the problems of voltage breakdown while increasing the speed of the translation circuit. In addition, the TTL output circuit is able to drive high capacitance loads. Furthermore, the tristate controller has few devices, thereby decreasing the complexity and increasing the speed of the controller.

A further understanding of the nature and advantages of the invention may be realized by reference to the remaining portions of the specification and the attached drawings.

A BRIEF DESCRIPTION OF THE DRAWINGS

FIG. 1 is a block diagram of a preferred embodiment of the invention; and

FIG. 2 is a schematic diagram of a preferred embodiment of the invention.

DETAILED DESCRIPTION OF THE PREFERRED EMBODIMENTS

FIG. 1 is a block diagram of a preferred tristate buffer 10 that receives a tristate signal and an ECL input signal and generates a corresponding tristated TTL output signal. The tristate buffer includes an ECL input circuit 12, a level shifter 14 including a voltage clamp 15 and a pull-up circuit 16, a TTL output circuit 18, and tristate controller 20 including a tristate signal input circuit 22, a tristate pull-up circuit 24 and a tristate control circuit 26.

ECL input circuit 12 receives and buffers the ECL input signal at node ECL Vin. The ECL input circuit then generates and transmits an intermediate signal at node PO corresponding to the ECL input signal. Level shifter 14 includes voltage clamp 15 for preventing the intermediate voltage signal from entering a constant low state, and also includes pull-up circuit 16 for preventing the intermediate voltage signal from entering a constant high state. TTL output circuit 18 generates and transmits a TTL output signal that corresponds to the intermediate voltage signal and, therefore, corresponds to the ECL input signal.

Tristate controller 20 includes tristate signal input circuit 22 for receiving a tristate signal and generating an intermediate tristate voltage signal at node P1. In addition, tristate controller 20 includes pull-up circuit 24 for preventing the intermediate tristate voltage signal from entering a constant low state. Furthermore, tristate controller 20 includes tristate control circuit 26 for causing the TTL output circuit to enter a high impedance state when the intermediate tristate voltage signal is in a high state and therefore, the tristate signal is in a high state.

FIG. 2 is a schematic diagram of a preferred ECL/TTL translator circuit 10' that includes an ECL input circuit 12', an intermediate voltage node P0', a level shifter 14' including a voltage clamp 15' and a pull-up circuit 16', a TTL output circuit 18', a tristate controller 20' including a tristate signal input circuit 22', an intermediate tristate voltage node P1', a tristate pull-up circuit 24', and a tristate control circuit 26' corresponding to the elements of the block diagram shown in FIG. 1.

ECL input circuit 12' includes an ECL cascode stage 30 and current source circuit 32. ECL cascode stage 30 compares ECL input signal ECL Vin with a reference voltage $V_{BB1}$ which is preferably set to approximately $-1.16$ volts. Current source circuit 32 also utilizes a reference voltage $V_{CSI}$ to provide a switching current to the ECL cascode. Reference voltage $V_{CSI}$ is normally set to approximately 1.32 above VEE or approximately $-3.68$ volts.

In the preferred embodiment, the ECL cascode includes transistors Q1 and Q2 with Q1 receiving the ECL Vin signal and Q2 receiving the reference voltage $V_{BB1}$. In addition, the current source circuit includes transistor Q3 and resistor R1 connected in series between the emitters of transistors Q1 and Q2 and ECL GND. The base of Q3 is connected to reference voltage $V_{CSI}$.

Upon receiving an ECL input signal in a low state (voltage less than $V_{BB1}$), transistor Q1 is turned on and current is pulled through transistor Q1 by current source circuit 22. Due to this current flow, transistor Q2 is turned off causing the voltage at node P0' to drop to one diode drop (1 Vbe or approximately 0.8 volts) above ECL GND. Upon receiving an ECL input signal in a high state (voltage greater than $-0.8$ volts), transistor Q1 turns off and current is pulled through transistor Q2 by current source circuit 22. Due to this current flow, transistor Q2 is turned on, thereby pulling the voltage at node P0' up to two diode drops (2 Vbe or approximately 1.6 volts) above ECL GND.

Level shifter 14' includes a voltage clamp 15' and pull-up circuit 16' coupled to node P0'. Voltage clamp 15' prevents the intermediate voltage signal on node P0' from entering a constant high state. Pull-up circuit 16' prevents intermediate voltage on node P0' from entering a constant low state.

In the preferred embodiment, voltage clamp 15' includes resistors R2 and R3 in parallel with resistor R2 being in series with diode D1 and D2 between TTL VCC and ECL GND. In addition, transistor Q4 is located in series with resistor R3 between TTL VCC and node P0'. When an intermediate low voltage signal is generated by the ECL input circuit voltage clamp 15' clamps node P0' at approximately 0.8 volts or 1 Vbe above TTL GND (diode D1+diode D2−transistor Q4). Pull-up circuit 16' includes a resistor R4 located between TTL VCC and node P0' to enhance rise time at node P0'. Furthermore, the low voltage swing at node P0' permits faster operation of the translation circuit.

TTL output circuit 18' includes several resistors and transistors for generating and driving a TTL output signal at node TTL Vout corresponding to the intermediate voltage signal at node P0'. Resistor R5, darlington configured transistor pair Q5 and Q6, and Schottky transistor Q7 are connected in series between TTL VCC and TTL GND. In addition, resistor R6, Schottky transistor Q8, resistors R7 and R8, and Schottky transistor Q9 are also connected in series between TTL VCC and TTL GND.

Upon receiving an intermediate low voltage signal of approximately 0.8 volts or 1 Vbe above ECL GND at node P0', transistor Q8 turns off causing transistor Q7 to turn off. Although darlington configured transistor pair Q5 and Q6 remain on, Schottky transistor Q7 pulls TTL Vout down to 1 Vbe (approximately 0.8 volts) above TTL GND. Upon receiving an intermediate high voltage signal of approximately 1.6 volts or 2 Vbe above ECL GND at node P0', transistor Q8 turns on causing transistor Q7 to turn on. As a result, TTL Vout is pulled upward to approximately 2.7 to 3.5 volts depending on the output capacitance load.

Tristate signal input circuit 22' includes a tristate signal cascode 40 and a tristate current source 42. Tristate signal cascode 40 compares tristate input signal Tin with a reference voltage $V_{BB1}$ which is preferably set to approximately $-1.16$ volts. Tristate current source 42 utilizes reference voltage $V_{CSI}$ to provide a switching current to the tristate signal cascode. Reference voltage $V_{CSI}$ is normally set to approximately 1.32 volts above VEE or approximately $-3.68$ volts.

In the preferred embodiment, the tristate signal cascode includes transistors Q11 and Q12 with Q11 receiving the tristate Tin signal and Q12 receiving the reference voltage $V_{BB1}$. In addition, the tristate current source includes transistor Q10 and resistor R9 connected in series between the emitter of transistors Q11 and Q12 and ECL VEE. The base of transistor Q10 is connected to reference voltage $V_{CSI}$.

Upon receiving a tristate input signal in a low state (voltage less than $V_{BB1}$), transistor Q11 is turned on and current is pulled through transistor Q11 by tristate current source circuit 42. Due to this current flow, transistor Q12 is turned off causing the voltage at node P1' to drop to one diode drop (1 Vbe or approximately 0.8 volts) above ECL GND. Upon receiving a tristate input signal in a high state (voltage greater than $-0.8$ volts), transistor Q11 turns off and current is pulled through transistor Q12 by tristate current source circuit 42. Due to this current flow, transistor Q12 is turned on, thereby pulling the voltage at node P1' up to two diode drops (2 Vbe or approximately 1.6 volts) above ECL GND.

In the preferred embodiment, tristate pull-up circuit 24' includes resistor R11 between TTL VCC and node P1' and resistor R10 and transistor Q13 in series between TTL VCC and node P1'. In addition, the base of transistor Q13 is coupled between diodes D1 and D2 of voltage clamp 15'. Tristate pull-up circuit 24' prevents the intermediate tristate voltage signal on node P1' from entering a constant low state.

Tristate control circuit 26' includes transistor Q14 coupled between node P3' and TTL GND. In addition, the collector of transistor Q14 is preferably coupled to TTL output circuit 18' between resistor R5 and transistor Q5. Upon tristate control circuit 26' receiving an intermediate tristate voltage signal in a low state or about TTL GND, transistor Q14 turns off. This allows TTL output circuit 18' to generate high or low TTL output signals depending upon the intermediate voltage signal at node P0'. Upon tristate control circuit 26' receiving an intermediate tristate voltage signal in a high state or approximately 1.6 volts above TTL GND, transistor Q14 turns on, thereby pulling current from TTL output circuit 18' at node P3'. This causes the TTL output circuit to enter the high impedance state wherein transistors Q5, Q6, Q7 and Q8 are turned off due to the low voltage at node P3'.

As is well understood by those familiar with the art, the present invention may be embodied in other specific forms without departing from the spirit or essential characteristics thereof. For example, the diodes may be replaced with transistors connected as diodes. For another example, TTL GND and ECL GND may be shorted together to reduce noise. Accordingly, the disclosure of the preferred embodiment of the invention is intended to be illustrative, but not limiting, of the scope of the invention which is set forth in the following claims.

What is claimed is:

1. A circuit for translating tristate signals and ECL level input signals to TTL level output signals, the circuit comprising:
    (a) ECL input means, responsive to the ECL level input signals, for generating an intermediate voltage signal corresponding to the ECL level input signals;
    (b) a level shifter, coupled to the ECL input means, for maintaining the intermediate voltage signal in a desired range of voltages;
    (c) TTL output means, coupled to the level shifter, responsive to the intermediate voltage signal, for generating TTL level output signals corresponding to the intermediate voltage, thereby providing TTL level output signals corresponding to ECL level input signals; and
    (d) a tristate controller, coupled to the level shifter and the TTL output means, responsive to the tristate signal, for causing the TTL output means to enter a high impedance state.

2. The circuit of claim 1 wherein the ECL input means comprises an ECL cascode for comparing the ECL input signal with a reference signal.

3. The circuit of claim 2 wherein the ECL input means further comprises a current source for providing a switching current to the ECL cascode.

4. The circuit of claim 1 wherein the level shifter comprises a voltage clamp, coupled to the ECL input means and the TTL output means, for preventing the intermediate voltage signal from entering a constant low state.

5. The circuit of claim 4 wherein the voltage clamp comprises two diodes and a transistor.

6. The circuit of claim 1 wherein the level shifter comprises a pull up means, coupled to the ECL input means and the TTL output means, for preventing the intermediate voltage signal from entering a constant high state.

7. The circuit of claim 6 wherein the pull up means comprises a resistor.

8. The circuit of claim 1 wherein the level shifter comprises:
    (a) a voltage clamp, coupled to the ECL input means and the TTL output means, for preventing the intermediate voltage signal from entering a constant low state; and
    (b) a pull up means, coupled to the ECL input means and the TTL output means, for preventing the intermediate voltage signal from entering a constant high state.

9. The circuit of claim 1 wherein the tristate controller comprises:
    (a) a tristate signal input circuit, responsive to the tristate input signals, for generating an intermediate tristate voltage signal corresponding to the tristate input signals; and
    (b) a tristate control circuit, coupled to the tristate signal input circuit, responsive to the intermediate tristate voltage signal, for causing the TTL output means to enter a high impedance state.

10. The circuit of claim 9 wherein the tristate signal input circuit further comprises a tristate signal cascode for comparing the tristate input signal with a reference signal.

11. The circuit of claim 10 wherein the tristate signal input circuit further comprises a tristate current source for providing a switching current to the tristate signal cascode.

12. The circuit of claim 9 wherein the tristate controller further comprises a tristate pull-up circuit coupled to the tristate control circuit, for preventing the intermediate tristate voltage signal from entering a constant low state.

13. The circuit of claim 9 wherein the tristate control circuit comprises a transistor.

14. A circuit for translating tristate signals, which have a high voltage state and a low voltage state, and ECL level input signals, which have a high voltage state and a low voltage state, to TTL level output signals, which have a high voltage state, a low voltage state, and a high impedance state, the circuit comprising:
    (a) ECL input means, responsive to the ECL level input signals, for generating an intermediate voltage signal corresponding to the ECL level input signals;
    (b) a level shifter, coupled to the ECL input means, for maintaining the intermediate voltage signal in a desired range of voltages;
    (c) TTL output means, coupled to the level shifter, responsive to the intermediate voltage signal, for generating TTL level output signals corresponding to the intermediate voltage, thereby providing TTL level output signals corresponding to ECL level input signals; and
    (d) a tristate controller, coupled to the level shifter and the TTL output means, responsive to the tristate signal, for causing the TTL output means to enter a high impedance state, the tristate controller including:
        (i) a tristate signal input circuit, responsive to the tristate input signals, for generating an intermediate tristate voltage signal corresponding to the tristate input signals;

(ii) a tristate control circuit, coupled to the tristate signal input circuit, responsive to the intermediate tristate voltage signal, for causing the TTL output means to enter a high impedance state; and (iii) a tristate pull-up circuit coupled to the tristate control circuit, for preventing the intermediate tristate voltage signal from entering a constant low state.

* * * * *